United States Patent
Xu et al.

(10) Patent No.: US 7,825,427 B2
(45) Date of Patent: Nov. 2, 2010

(54) METHOD AND APPARATUS FOR GENERATING PHOSPHOR FILM WITH TEXTURED SURFACE

(75) Inventors: Tao Xu, Fremont, CA (US); Alex Shaikevitch, San Jose, CA (US)

(73) Assignee: Bridgelux, Inc., Livermore, CA (US)

( * ) Notice: Subject to any disclaimer, the term of this patent is extended or adjusted under 35 U.S.C. 154(b) by 138 days.

(21) Appl. No.: 12/209,638

(22) Filed: Sep. 12, 2008

(65) Prior Publication Data

US 2010/0066236 A1    Mar. 18, 2010

(51) Int. Cl.
*H01L 33/00* (2010.01)
(52) U.S. Cl. ........................... 257/100; 313/512
(58) Field of Classification Search ......... 313/500–512; 257/98–100
See application file for complete search history.

(56) References Cited

U.S. PATENT DOCUMENTS

| | | | |
|---|---|---|---|
| 5,686,738 A | 11/1997 | Moustakas | |
| 6,091,085 A | 7/2000 | Lester | |
| 6,410,942 B1 | 6/2002 | Thibeault et al. | |
| 6,498,355 B1 * | 12/2002 | Harrah et al. | 257/99 |
| 6,513,949 B1 | 2/2003 | Marshall et al. | |
| 6,600,175 B1 | 7/2003 | Baretz et al. | |
| 6,657,236 B1 | 12/2003 | Thibeault et al. | |
| 6,692,136 B2 | 2/2004 | Marshall et al. | |
| 6,870,191 B2 | 3/2005 | Niki et al. | |
| 7,235,819 B2 | 6/2007 | Moustakas | |
| 2005/0265404 A1 | 12/2005 | Ashdown | |
| 2008/0128730 A1* | 6/2008 | Fellows et al. | 257/98 |

OTHER PUBLICATIONS

U.S. Appl. No. 12/130,459, filed May 20, 2008, Xu.
U.S. Appl. No. 12/163,594, filed Jun. 27, 2008, Xu.

* cited by examiner

*Primary Examiner*—Nimeshkumar D Patel
*Assistant Examiner*—Mary Ellen Bowman
(74) *Attorney, Agent, or Firm*—JW Law Group; James M. Wu (57) ABSTRACT

An optical device deploring a phosphor layer having a textured surface to improve output of visual light is disclosed. A light emitting device includes a solid state light emitter and a phosphor layer. The solid state light emitter, for example, is configured to convert electrical energy to optical light. The phosphor layer includes a first surface and a second surface, wherein the first surface, for example, is the top surface while the second surface is the bottom surface. The phosphor layer is disposed over the solid state light emitter for generating luminous light in response to the optical light. The first surface of the phosphor layer, in one embodiment, is configured to include a texture, which has similarly shaped uniform configurations, capable of reducing total internal reflection.

20 Claims, 10 Drawing Sheets

METHOD AND APPARATUS FOR GENERATING PHOSPHOR FILM WITH TEXTURED SURFACE

FIELD

The exemplary aspect(s) of the present invention relates to lighting devices. More specifically, the aspect(s) of the present invention relates to solid state light emitting devices.

BACKGROUND

As light output from LEDs or solid state light sources improve quickly and become increasingly viable alternatives, conventional lightings such as incandescent lamps and fluorescent lamps will soon be replaced with energy-efficient LEDs. A conventional LED is small and energy efficient with a good lifetime. Various commercial applications of LEDs, such as traffic lights, automobile lightings, and electronic billboards, have already been placed in service.

An important aspect of solid state optical property in applying general illumination is total luminous flux, or overall visible lighting output. A problem associated with lighting output from a solid state light emitter or LED is the total internal reflection ("TIR") phenomenon. When a light ray or beam crosses between two different materials with two different medium having different refractive indices, the TIR phenomenon occurs. For instance, when light ray strikes boundaries between two layers having different materials with different refractive indices, the light ray may be partially refracted at the boundary surface, and partially reflected through a layer.

The occurrence of the TIR phenomena within solid state lighting devices normally impacts and reduces luminous efficiency. In some instances, the TIR phenomena can generate heat from the reflective light. For example, when the blue optical light generated by LED strikes at an area of relatively flat surface of a phosphor layer, a TIR phenomenon between the phosphor layer and the LED may occur depending on the angle of the optical light with respect to the surface of the phosphor layer.

SUMMARY

An optical device employing a phosphor layer having a textured surface to improve output of the visual light is disclosed. A light emitting device includes a solid state light emitter and a phosphor layer. The solid state light emitter, for example, is capable of converting electrical energy to optical light. The phosphor layer has a first surface and a second surface, wherein the first surface, for example, is the top surface while the second surface is the bottom surface. The phosphor layer is disposed over the solid state light emitter for generating luminous light in response to the optical light. The first surface of the phosphor layer, in one embodiment, is configured to include a textured surface, which has similarly shaped uniform configurations, capable of reducing total internal reflection ("TIR") between the solid state light emitter and the phosphor layer.

Additional features and benefits of the exemplary aspect(s) of the present invention will become apparent from the detailed description, figures and claims set forth below.

BRIEF DESCRIPTION OF THE DRAWINGS

The exemplary aspect(s) of the present invention will be understood more fully from the detailed description given below and from the accompanying drawings of various aspects of the invention, which, however, should not be taken to limit the invention to the specific aspects, but are for explanation and understanding only.

FIGS. 2(a-b) is a cross-section view of an optical device having a phosphor layer with a textured surface and a light extracting layer in accordance with an aspect of the present invention;

FIGS. 7(a-d) illustrate examples of textured configuration for a phosphor layer in accordance with an aspect of the present invention;

DETAILED DESCRIPTION

Aspect(s) of the present invention is described herein in the context of a method, device, and apparatus of improving luminous output from a solid state light emitter using textured surface.

Those of ordinary skills in the art will realize that the following detailed description of the exemplary aspect(s) is illustrative only and is not intended to be in any way limiting. Other aspects will readily suggest themselves to such skilled persons having the benefit of this disclosure. Reference will now be made in detail to implementations of the exemplary aspect(s) as illustrated in the accompanying drawings. The same reference indicators will be used throughout the drawings and the following detailed description to refer to the same or like parts.

In the interest of clarity, not all routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming, but would nevertheless be a routine undertaking of engineering for those of ordinary skilled in the art having the benefit of this disclosure.

It is understood that an aspect of the present invention may contain integrated circuits that are readily manufacturable using conventional semiconductor technologies, such as, CMOS (complementary metal-oxide semiconductor) technology, MEMS (Micro-electromechanical systems) technology, or other semiconductor manufacturing processes. In addition, the aspect of the present invention may be implemented with other manufacturing processes for making optical as well as electrical devices.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The present aspect(s) of the invention illustrates a lighting device, which uses a phosphor layer having a textured surface to improve the output of visual light. A lighting device includes a solid state light emitter and a phosphor layer. The solid state light emitter, for example, is configured to convert electrical energy to optical light. The phosphor layer has a first surface and a second surface, wherein the first surface, for example, is the top surface while the second surface is the bottom surface. The phosphor layer is disposed over the solid state light emitter for generating luminous light in response to the optical light. The first surface of the phosphor layer, in one embodiment, is configured to include a texture, which has similarly shaped continuous uniform configurations capable of reducing total internal reflection ("TIR") between the solid state light emitter and the phosphor layer.

Figure 1:
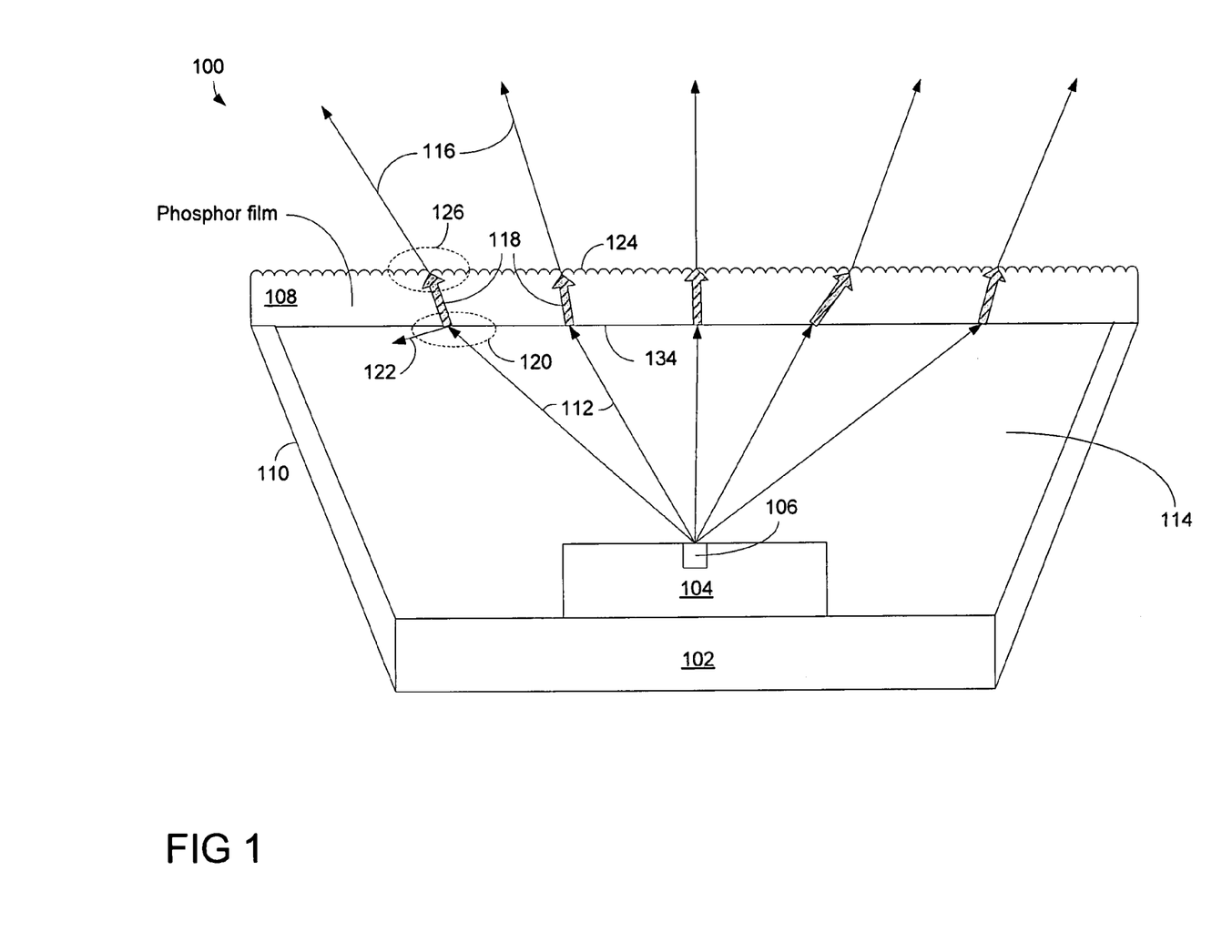
FIG. 1 is a cross-section view of an optical device including a phosphor layer having a textured surface in accordance with an aspect of the present invention.

FIG. 1 is a cross-section view of an optical device 100 including a phosphor layer having a textured surface in accordance with an aspect of the present invention. Device 100 includes a substrate 102, a solid state light emitter 104, a phosphor layer 108, and walls 110. Walls 110 are used to separate optical device 100 from other components such as neighboring optical devices. Substrate 102, for example, is further coupled to a circuit board, not shown in FIG. 1. Device 100, in an aspect, etches a textured surface over phosphor layer 108 to reduce the phenomenon of TIR. The total luminous lighting output for device 100 is enhanced when TIR is minimized. It should be noted that the underlying concept of the exemplary aspect(s) of the present invention would not change if one or more blocks (or layers) were added to or removed from device 100.

Solid state light emitter 104, in one example, is a light emitting die, which can be manufactured by a semiconductor fabrication process. A function of solid state light emitter 104 is to convert electrical energy to optical light. Solid state light emitter 104 can be a light emitter diode ("LED"), which is capable of transferring electrical energy to optical energy via a biased p/n junction. The terms "LED", "optical light emitter die", and "solid state light emitter" can be used interchangeably hereinafter. Solid state light emitter or LED 104 can be installed or attached to a substrate 102, wherein substrate 102 facilitates communication between LED 104 and other devices via contacts and wire bond connections located on substrate 102. LED chips, for example, can be bonded either directly onto a substrate or a regular LED reflector cup, not shown in FIG. 1. It should be noted that solid state light emitter can be replaced with any other types of lighting elements capable of converting electrical energy to optical light (or visible lightings).

LED 104 further includes a lighting window 106, which is configured to emitting blue light. For example, window 106 may include a layer of indium tin oxide ("ITO") to generate optical light or blue light 112. It should be noted that LED 104 may include multiple ITO windows, wherein the size of windows may vary depending on the applications. Space 114 between LED 104 and phosphor layer 108 can be filled with clear silicon or air. For example, air and/or gas may be used to fill space 114 between phosphor layer 108 and LED 104 for light extracting and traveling. The clear silicon can also be used to fill space 114 to assist, for example, light extraction from LED 104.

Phosphor film or layer 108, in an aspect, is a continuous yellow phosphor layer disposed over LED 104. The terms "phosphor film" and "phosphor layer" refer to the similar layer(s) and they can be used interchangeably. A function of phosphor layer 108 is to convert blue light 112 to bright yellow light 116. Blue light or blue optical light 112, which generally has relatively low luminous intensity, is emitted from LED 104. Bright yellow light 116, on the other hand, is also referred to as cool light, cool white light, or luminous cool light and it contains relatively high luminous intensity or flux or LOP. Phosphor layer 108, in an aspect, can also be a continuous green phosphor layer over LED 104. Similar to a yellow phosphor layer, the green phosphor layer is also capable of generating bright cool light 116 in accordance with blue optical light 112 emitted by LED 104. Note that although cool white light provides higher LOP, it offers poor CRI rating. It should be noted that other colors of phosphor layer may be used to replace the yellow or green phosphor layer as long as they have an optical wavelength range from 490 nm to 590 nm. Optical wavelengths are also known as electromagnetic radiation wavelengths, radiation wavelengths, visible light wavelengths, optical spectrum wavelengths, and the like.

Phosphor layer 108 includes various material substances such as phosphor for creating a phenomenon of phosphorescence. Phosphorescence, for example, is a lighting process wherein energy absorbed by the substance is released relatively slowly in the form of light. Depending on selected color, different colors of phosphors can be made from one or more substances, such as oxides, sulfides, selenides, halides, silicates of zinc, cadmium, manganese, aluminum, silicon, and the like. Phosphor substances may further include activators that are used to prolong the emission of light. For example, phosphors may include copper-activated zinc sulfide or silver-activated zinc sulfide. It should be noted that similar phosphor-like layers may be used to replace phosphor layer 108 to achieve similar lighting results.

Referring back to FIG. 1, optical light 112 travels from LED 104 to phosphor layer 108. After optical light 112 strikes at an area 120 of bottom surface 134 of phosphor layer 108, light 112 may split into a refractive light and a reflective light, wherein the refractive light enters phosphor layer 108 and subsequently becomes transition light 118 traveling through phosphor layer 108. In an aspect, transition light 118 converts its physical optical property from blue dim light to cool bright light. When transition light 118 reaches at an area 126 of top surface 124 of phosphor layer 108, light 118 becomes bright cool light 116 after it leaves phosphor layer 108. Reflective light 122 is caused by TIR and it does not contribute to overall device luminous output. Depending on the thickness of phosphor layer 108, a TIR phenomenon can happen at area 120, area 126, or both areas 120 and 126.

TIR can be viewed as a light phenomenon, wherein TIR occurs when a light ray strikes a surface of a medium with an angle greater than a critical angle. The critical angle is defined as the largest angle of ray incidence in which light refraction can partially still occur. In other words, TIR happens when a light ray travels from a denser medium to a less dense medium, and the angle of incidence for the light ray is greater than the critical angle. For example, when transition light 118 travels through phosphor layer 108, which has a denser medium (or higher refractive index) than air, TRI can occur if angles of incidences for optical light 112 are greater than the critical angle(s).

To reduce the TIR effect, a textured top surface 124 of phosphor layer 108 is structured to include a surface of continuous configurations. The continuous configurations include continuously uniformed hemispheres with micro-sized diameters. Because of micro-sized hemispheres, the incident ray angle with respect to top surface 124 changes and consequently, the TIR phenomenon is reduced. Depending on the thickness of phosphor layer 108, the TIR phenomenon as indicated by arrow 122 can occur at bottom surface 134 of phosphor layer 108 since the textured surface is located on top surface 124 of phosphor layer 108. If the distance (thickness) between top surface 124 and bottom surface 134 is sufficiently small, the textured surface on top surface 124 can also help to reduce the TIR occurrence at bottom surface 134.

In an aspect, a light emitting device 100 having phosphor layer 108 and LED 104 is capable of converting electrical energy to optical light. Phosphor layer 108, which includes a textured top surface 124 and a bottom surface 134, is disposed over LED 104 to produce luminous light 116 in accordance with optical light 112. Textured top surface 124 is a surface having similarly shaped continuous configurations, which is capable of reducing the TIR effect between LED 104 and phosphor layer 108. Device 100 may further include a light extracting layer disposed between phosphor layer 108 and LED 104 for extracting optical light 112. The textured top surface 124, in an aspect, is a surface of two-dimensional uniformly distributed triangles, hemispheres, or a combination of triangles and hemispheres. The diameter of each hemisphere, for instance, has a range from 0.1 micrometer to 1 millimeter.

It should be further noted that underlying concept of the exemplary aspect(s) of the present invention would not change if dimension(s) of substrate 102, solid state light emitter 104, light extracting layer, and/or phosphor layer is changed. In an aspect, the size of substrate 102 is smaller than light emitter 104. The size of phosphor layer 108 can also vary depending on the applications. For example, device 100 produces similar light with similar CRI rating if the size of phosphor layer 108 becomes larger than light extracting layer.

An advantage of deploying a textured surface is to reduce the TIR effect and consequently, improve overall visible light output.

Figure 2A:
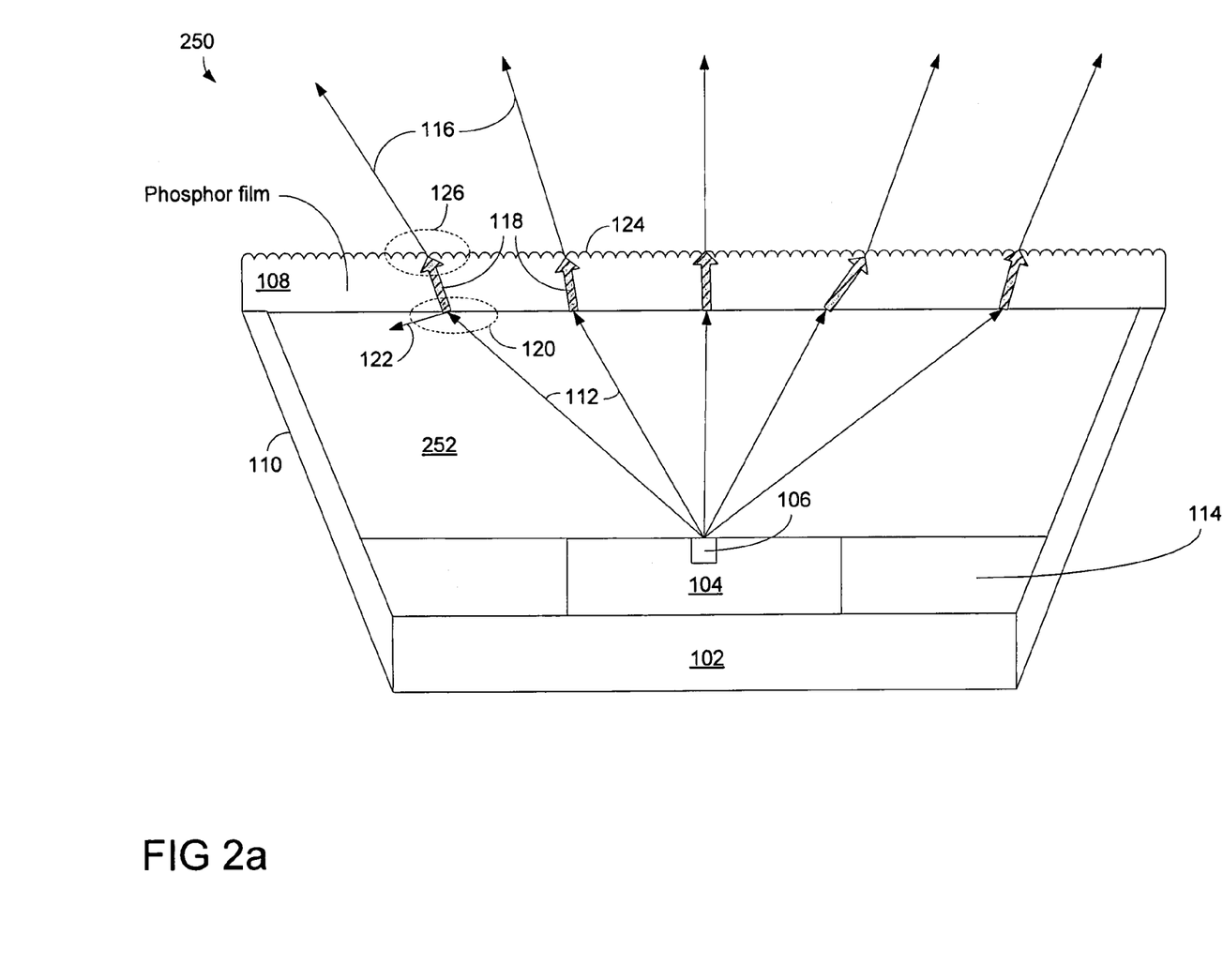

FIG. 2(*a*) is a cross-section view of an optical device 250 having a phosphor layer with a textured surface and a light extracting layer in accordance with an aspect of the present invention. Device 250 includes a substrate 102, a solid state light emitter 104, a phosphor layer 108, and walls 110. Device 250 further includes a light extracting layer 252 used to enhance light output. As device 100, device 250, in an aspect, employs phosphor layer 108 having a textured surface 124 to reduce TIR. It should be noted that the underlying concept of the exemplary aspect(s) of the present invention would not change if one or more blocks (or layers) were added to or removed from device 250.

Referring to FIG. 2(*a*), a first surface of LED 104 is attached to substrate 102 and a second surface of LED 104 is coupled to a light extracting layer 252. Light extracting layer 252, in an aspect, is a clear silicone layer capable of extracting or amplifying optical light or blue light emitted by LED 104. For example, light extracting layer 252 assists LED 104 to generate sufficient blue optical light to satisfy a predefined laminating requirement. Blue light emitted by LED 104 via clear silicone layer 252 enhances luminous intensity or luminous flux of the optical light. It should be noted that light extracting layer 252 is not necessary in order for device 250 to work. LED 104, however, may not produce sufficient optical light without light extracting layer 252. As such, a more powerful and larger LED or a LED with better light extraction may be required to achieve similar results as if a light extracting layer was employed.

Light extracting layer 252, in an aspect, is structured in a sheet or a layer formation, as illustrated in FIG. 2(*a*). Additional layer(s), substances, liquid, and/or gas may be inserted between phosphor layer 108 and light extracting layer 252. Light extracting layer 252 can be composed of materials other than clear silicon as long as it can perform similar light extracting functions as the clear silicon. In another aspect, the size of light extracting layer is smaller than light emitter 104. Light extracting layer 252 can also be structured in various different shapes and/or blocks.

Figure 2B:
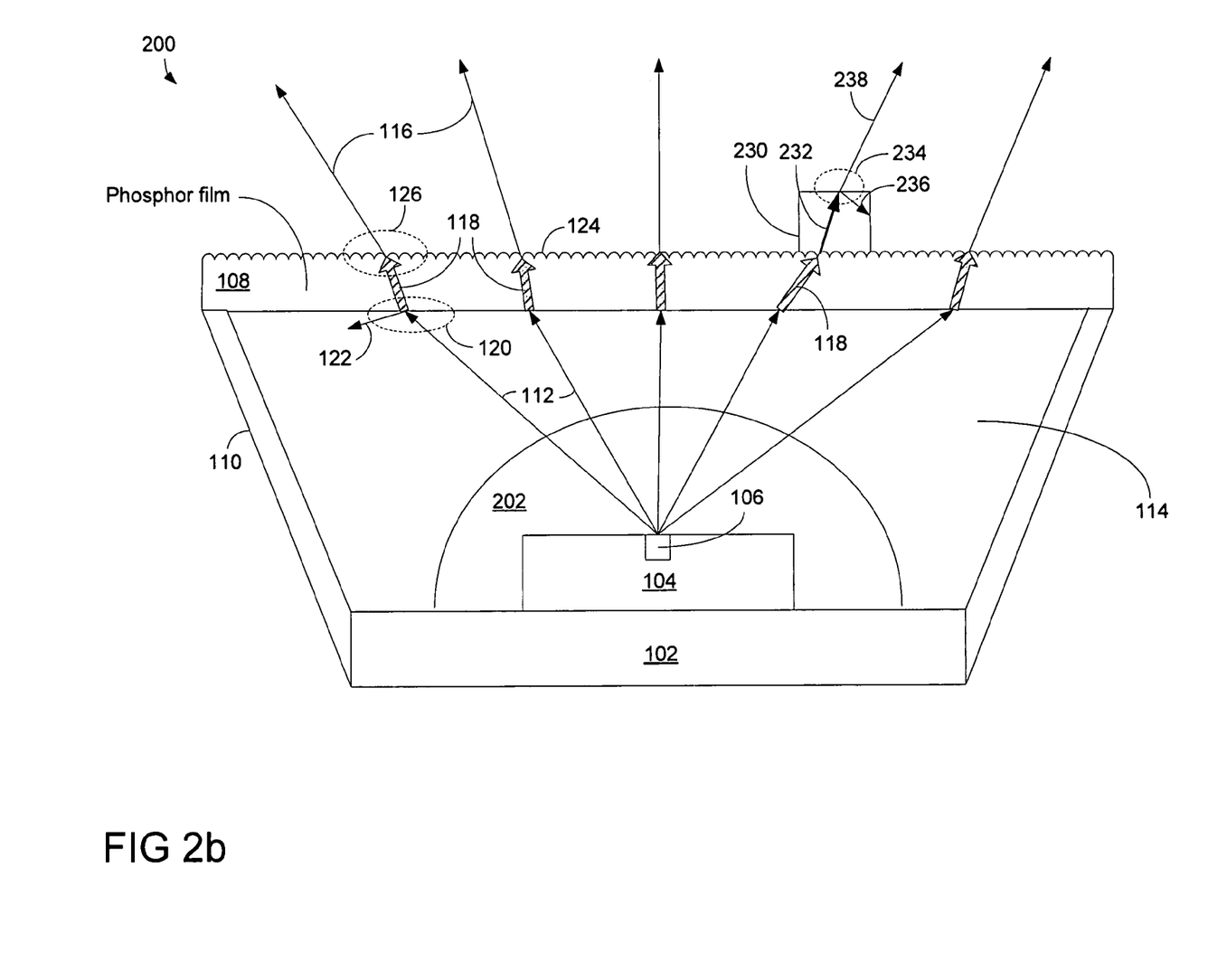

FIG. 2(*b*) is a cross-section view of an optical device 200 having a phosphor layer with a textured surface and a dome shaped light extracting layer in accordance with an aspect of the present invention. Device 200 includes a substrate 102, a solid state light emitter 104, a phosphor layer 108, and walls 110. Device 200 further includes a light extracting dome 202 used to enhance light output. Device 200, in an aspect, employs phosphor layer 108 having a textured surface 124 to reduce TIR.

Light extracting dome 202, in an aspect, is a clear silicone dome capable of extracting or amplifying optical light emitted by LED 104. For example, light extracting dome 202 assists LED 104 to generate sufficient blue light for lighting. Blue light emitted by LED 104 via clear silicone dome 202 enhances luminous intensity. It should be noted that light extracting dome 202 is not necessary in order for device 200 to emit light. LED 104, however, may not emit as much light as it would have if light extracting dome 202 is not present. When light extracting dome 202 is absent, a more powerful LED or LED with better light extraction or performance may be required to compensate the missing dome. It should be noted that dome 202 may or may not contact phosphor layer 108. Other layer, substances, liquid, and/or gas may be added between dome 202 and phosphor layer 108.

Device 200 further includes an array of phosphor islands 230 dispensed over phosphor layer 108 for improving the Color Rendering Index ("CRI") rating. The quality of a light source on color appearance of object is rated or measured by the CRI rating. The CRI rating indicates whether the light is cool white light or natural white light. Phosphor islands 230 are arranged in an array formation, wherein each island is structured in a dome or lens shape. Spacing between phosphor islands 230 is used to facilitate a passage for cool white light 116 to pass. Blue light 112, for example, enters phosphor layer 108 and travel through phosphor layer 108 as light 118. Spacing between islands 230 allows light 118 to exit phosphor layer 108 and become cool white light 116 without impediment or obstruction.

When transition light 118 enters island 230, it becomes warm transition light 232 and warm transition light 232 becomes warm light 238 after it exits island 230. Depending on the thickness of the island, a TIR effect 236 can occur within island 230 when a light incident angle is greater than the critical angle. As such, a textured surface for island 230 can also be applied to enhance the light output. An advantage of using phosphor islands 230 is to better facilitate and control distribution of warm light.

Figure 3:
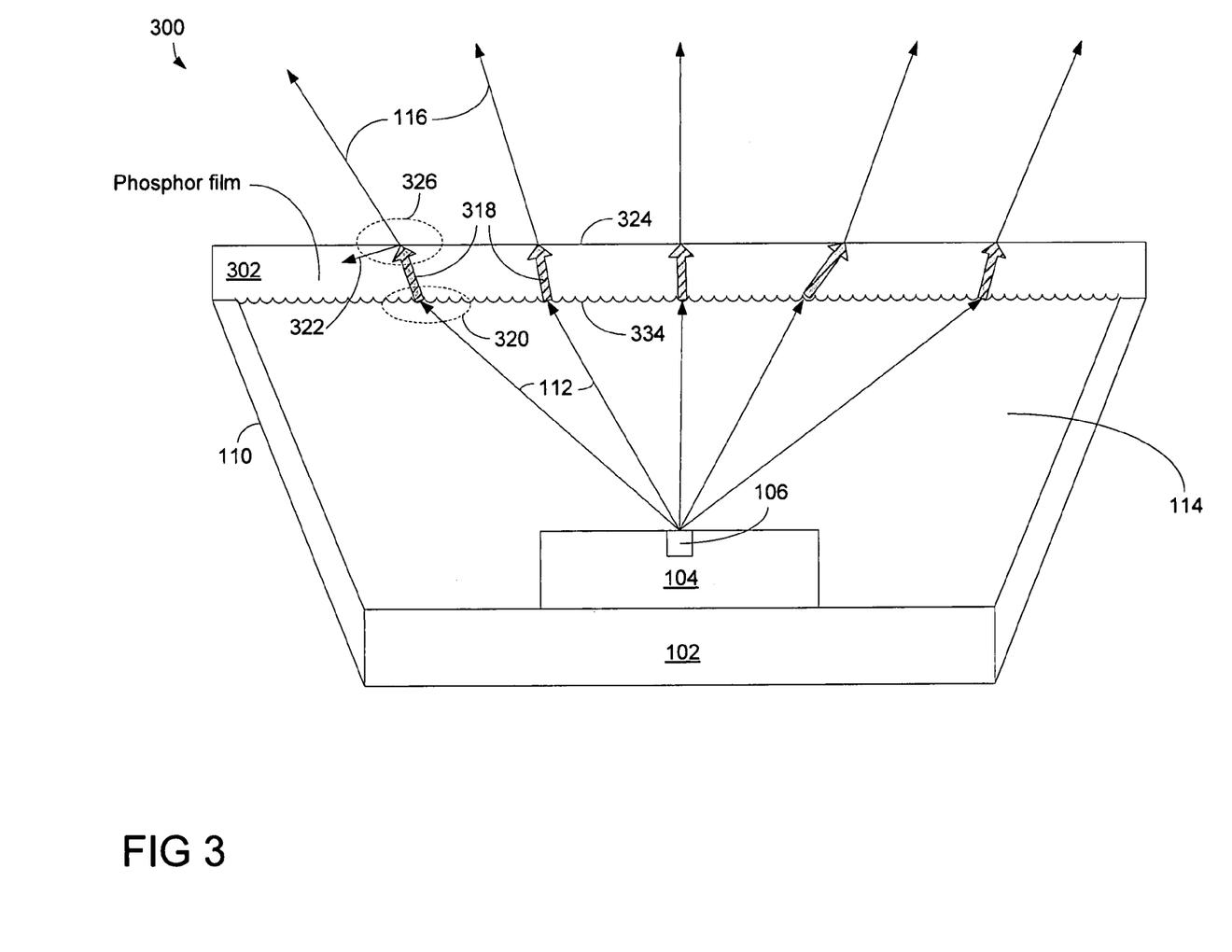
FIG. 3 illustrates an exemplary lighting device having a phosphor layer with a textured bottom surface in accordance with an aspect of the present invention.

FIG. 3 illustrates an exemplary lighting device 300 having a phosphor layer with a textured bottom surface in accordance with an aspect of the present invention. Device 300 includes a substrate 102, a solid state light emitter 104, a phosphor layer 302, and walls 110. Device 300, in an aspect, employs phosphor layer 302 having a textured surface 334 to reduce TIR. It should be noted that the underlying concept of the exemplary aspect(s) of the present invention would not change if one or more blocks (or layers) were added to or removed from device 300.

Phosphor layer or film 302 includes a top surface 324 and a bottom surface 334, wherein bottom surface 334 is textured. To control and/or reduce the TIR effect, bottom surface 334 of phosphor layer 302 is structured to include a textured surface having continuous configurations. For example, the continuous configurations indicate an area containing at least two-dimensional continuously uniformed hemispheres or triangles, wherein diameters of hemispheres or segments of triangles are set to micro-sized dimensions such as 1 micrometer. Because of micro-sized hemispheres or triangles, individual angle of each incident light beam has been changed and consequently, the TIR phenomenon is reduced. The angle of incident light beam or light ray is the angle between the light beam (ray) and a surface of phosphor layer 108 such as bottom surface 334. Depending on the thickness of phosphor layer 302, TIR as indicated by arrow 322 can occur at top surface 324 of phosphor layer 302 since the textured surface is located at bottom surface 334. If the distance (thickness) between top surface 324 and bottom surface 334 is sufficiently small (or thin), the textured surface on bottom surface 334 can also help to reduce the TIR occurrence at top surface 324.

In operation, optical light 112 travels from LED 104 to phosphor layer 302 via air 114. After optical light 112 strikes at an area 320 at bottom surface 334 of phosphor layer 302, it becomes transition light 318 moving through the medium of phosphor layer 302. Note that because of textured surface containing continuous micro-sized configurations at bottom surface 334, the occurrence of TIR at area 320 is reduced. When transition light 318 reaches an area 326 of top surface 324 of phosphor layer 302, it is transformed into bright cool light 116 after passing through the medium of phosphor layer 302. It should be noted that TIR 322 can occur when transition light 318 strikes at area 326 at an angle greater than the critical angle. Depending on the thickness of phosphor layer 302, formation of textured surface at bottom surface 334 can reduce the TIR phenomenon 322 at area 320, area 326, or both areas 320 and 326.

Figure 4:
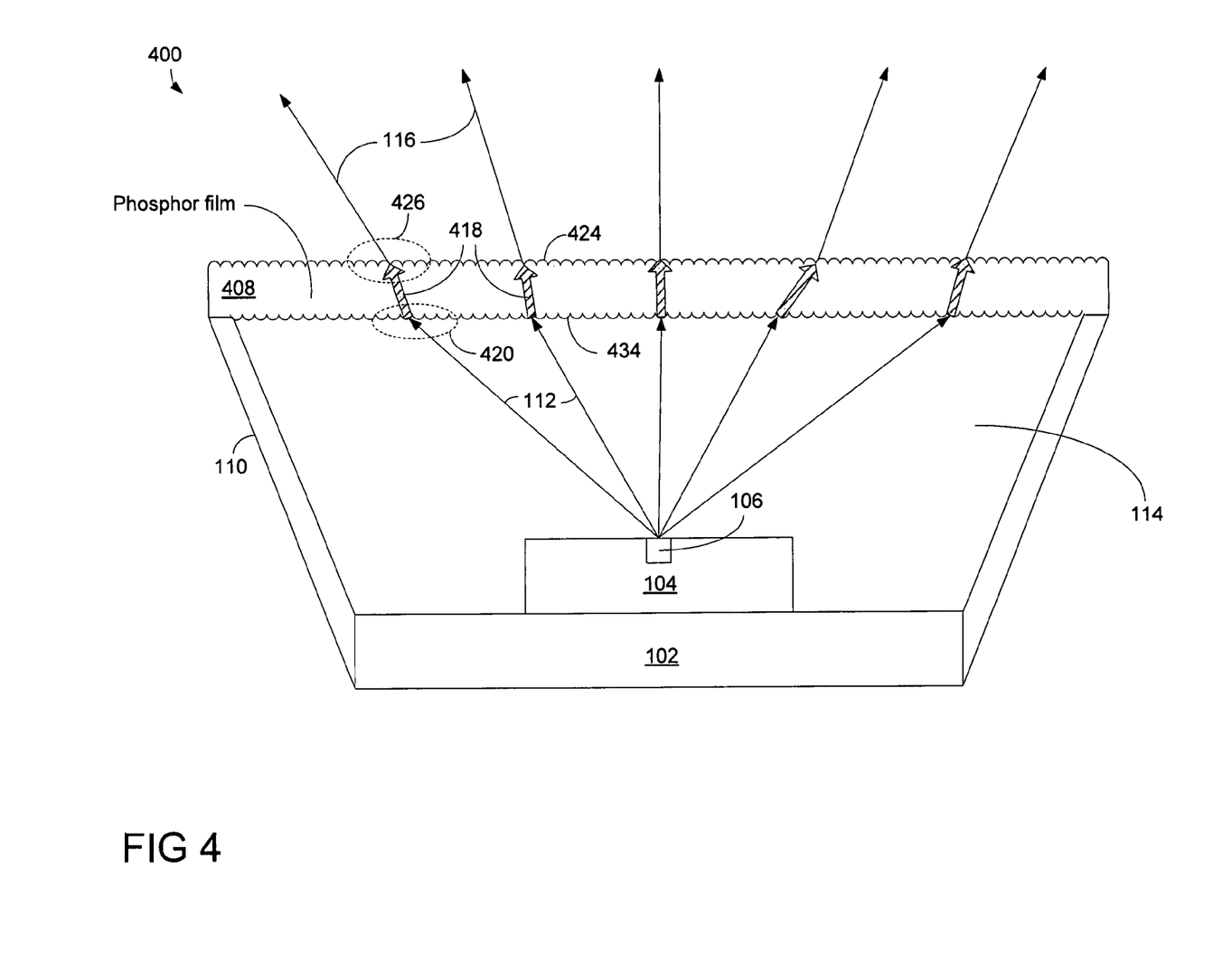
FIG. 4 is a cross-section view of an example of an optical device including a phosphor layer with two textured surfaces in accordance with an aspect of the present invention.

FIG. 4 is a cross-section view of an example of an optical device 400 including a phosphor layer with two textured surfaces in accordance with an aspect of the present invention. Device 400 includes a substrate 102, a solid state light emitter 104, a phosphor layer 408, and walls 110. Device 400 employs phosphor layer 408 having a textured bottom surface 434 and a textured top surface 424 for reducing the TIR effect. It should be noted that the underlying concept of the exemplary aspect(s) of the present invention would not change if one or more blocks (or layers) were added to or removed from device 400.

Phosphor layer or film 408 includes a textured top surface 424 and a textured bottom surface 434 for TIR controlling. To control and/or minimize TIR effects, both top and bottom surfaces 424 and 434 of phosphor layer 408 are configured to include textured surfaces with continuous configurations. As mentioned earlier, the continuous configurations indicate an area containing at least two-dimensional continuously uniformed hemispheres or triangles, wherein diameters of hemispheres or segments of triangles are set to micro-sized dimensions such as 1 micrometer. Because of micro-sized hemispheres or triangles, individual angle of each incident light beam has been changed and consequently, the TIR phenomenon is reduced.

During an operation, optical light 112 travels from LED 104 to phosphor layer 302 via air 114. After optical light 112 strikes at an area 420 at bottom surface 434 of phosphor layer 408, it is transformed into a transition light 418 capable of moving through the medium of phosphor layer 408. Note that because of textured surface containing continuous micro-sized configurations on bottom surface 434, the occurrence of TIR at area 420 is reduced. When transition light 418 reaches an area 426 of top surface 424 of phosphor layer 408, it is transformed into bright cool light 116 after leaving the medium of phosphor layer 408. It should be noted that because of textured surface containing continuous micro-sized configurations on top surface 424, the occurrence of TIR at area 426 is minimized or reduced. It should be noted that to minimize the TIR phenomenon, texturing both top and bottom surfaces of phosphor layer 408 can be deployed.

Figure 5:
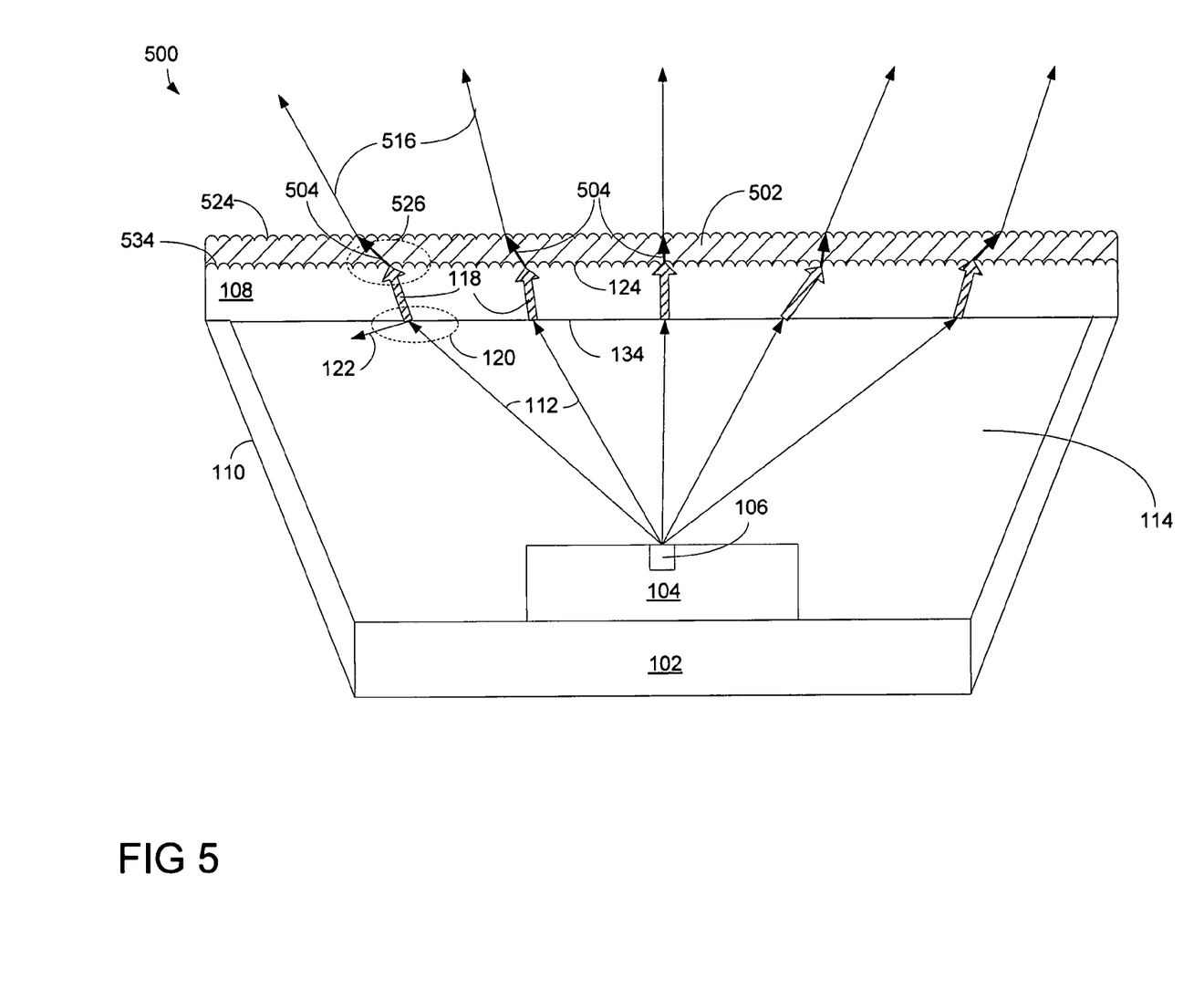
FIG. 5 is a cross-section diagram illustrating an optical device capable of generating natural white and warm white light using a textured phosphor film in accordance with an aspect of the present invention.

FIG. 5 is a cross-section diagram illustrating an optical device 500 capable of generating natural white and warm white light using a textured phosphor film in accordance with an aspect of the present invention. Device 500 includes a substrate 102, a LED 104, a phosphor layer 108, a warm phosphor layer 502, and walls 110. Device 500 employs a technique of texturing surfaces to reduce the TIR phenomenon. It should be noted that the underlying concept of the exemplary aspect(s) of the present invention would not change if one or more blocks (or layers) were added to or removed from device 500.

To improve CRI rating, device 500 includes a warm phosphor layer 502, which can be a red or orange phosphor layer used for generating natural white or warm white light. Layer 502 includes a top surface 524 and a bottom surface 534, wherein at least one of surfaces 524 and 534 is textured. For example, top surface 524 of layer 502 includes a textured surface, which includes an area having at least two-dimensional continuously uniformed hemispheres or triangles. The diameters of hemispheres or segments of triangles, for instance, can be set to micro-sized dimensions such as 1 micrometer. Because of micro-sized hemispheres or triangles, angles of incident red light ray have been changed and consequently, the TIR phenomenon for warm phosphor layer 502 is also reduced.

During an operation, optical light 112 travels from LED 104 to phosphor layer 302 via air 114. After optical light 112 strikes at an area 120 at bottom surface 134 of phosphor layer 108, it is transformed into a transition light 118 moving through the medium of phosphor layer 108. Note that because of textured surface containing continuous micro-sized configurations on top surface 124 of phosphor layer 108, the occurrence of TIR at area 120 may be reduced. When transition light 118 reaches an area 526 of top surface 124 of phosphor layer 108 and/or bottom surface of warm phosphor layer 502, it is transformed into a natural transition light 504 after leaving the medium of phosphor layer 108. Light 504 becomes natural white or warm white light 516 after it leaves warm phosphor layer 502. It should be noted that because of textured surface containing continuous micro-sized configurations on top surface 524, the occurrence of TIR in layer 502 is minimized or reduced.

Figure 6:
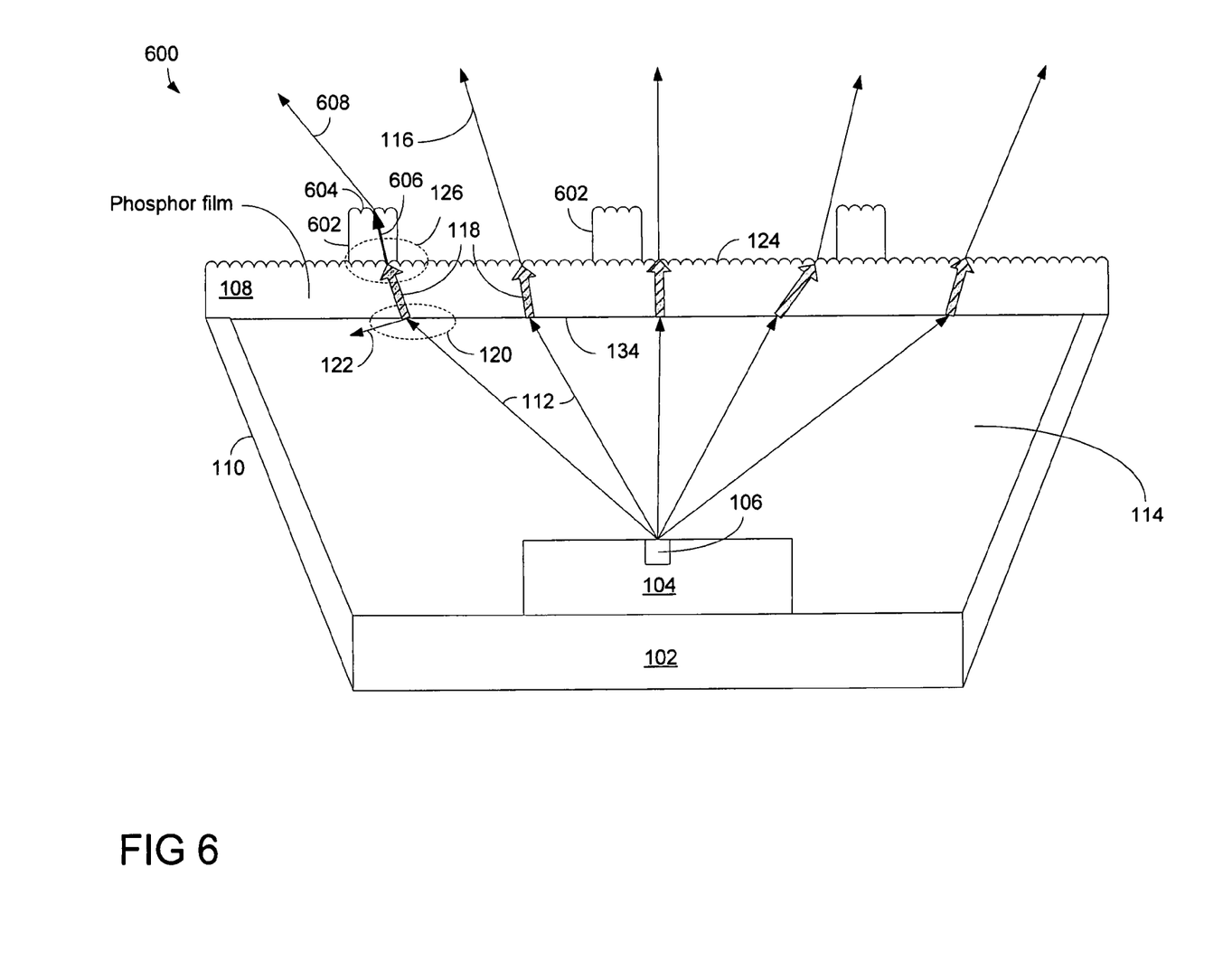
FIG. 6 is a cross-section diagram illustrating an optical device capable of generating natural white and warm white light using textured phosphor islands in accordance with an aspect of the present invention.

FIG. 6 is a cross-section diagram illustrating an optical device 600 capable of generating natural white and warm white light using textured phosphor islands in accordance with an aspect of the present invention. Device 600 includes a substrate 102, a LED 104, a phosphor layer 108, and an array of phosphor islands 602. To reduce the TIR phenomenon, the technique of texturing surface(s) is used in device 600. It should be noted that the underlying concept of the exemplary aspect(s) of the present invention would not change if one or more blocks (or layers) were added to or removed from device 600.

To improve CRI rating, multiple phosphor islands 602, as shown in FIG. 6, are arranged in an array formation, in which sufficient space between phosphor islands is allocated. For example, spacing between phosphor islands 602 may be used to create a passage for cool white light 116 to pass. Phosphor islands 602, in an aspect, are capable of converting at least a portion of cool white light 606 to warm light 608 (or neutral white). Upon generation of warm light 608, it is mixed or combined with cool white light 116 to generate cool white (with high CRI), warm, or natural white light. The cool white, warm white or natural white light should have a CRI range of 70 to 100.

In an aspect, phosphor islands 602 are configured to be red phosphor islands capable of generating red (or warm) light in response to a portion of cool white light. For example, a portion of cool white light 606 enters in one side of a red phosphor island 602 from phosphor layer 108 and red light or warm light 608 leaves from another side of red phosphor islands 602. Note that as soon as the yellow light hits a red phosphor island, the yellow light is immediately converted into red or warm light. Red light mixed with cool yellow light generates warm white or neutral white light. Red light from phosphor islands improves overall CCT (Correlated Color Temperature) and CRI rating. CCT and CRI are a measurement used to evaluate color quality of generated light. Phosphor islands 602, in another example, are orange phosphor islands or objects or dots for providing orange light. Other colors of phosphor islands can also be used to replace red or orange phosphor islands as long as they have an optical wavelength range from 590 nm to 700 nm. It should be noted that although orange or red light have lower efficiency (LOP) than yellow light, orange or red light enhances CRI rating.

Each phosphor island 602, in an aspect, includes a textured top surface 604 to reduce the TIR phenomenon. Depending on the applications, a phosphor island 602 can also include a textured bottom surface, which is in contact with top surface 124 of phosphor layer 108. For example, textured top surface 604 of a phosphor island, which contains a surface of continuous micro-sized configurations, reduces the TIR effect and consequently, enhances total luminous output of warm light 608. The underlying concept of the exemplary aspect(s) would not change if the shape and/or size of the island changes. Depending on the applications, one textured surface (either top or bottom surface) may be sufficient to minimize the TIR phenomenon.

An advantage of using optical device 600 having phosphor islands distributed over a phosphor layer with selected textured surfaces is to improve the overall light output together with enhanced CRI rating.

Figure 7A:
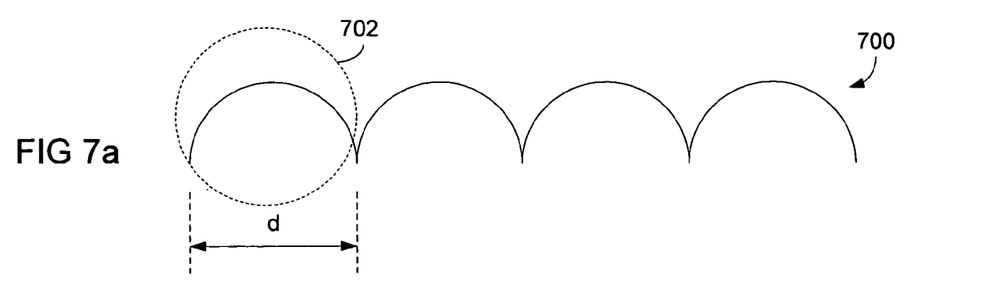

FIG. 7(a) illustrates an example of hemisphere textured configuration 700 for a phosphor layer in accordance with an aspect of the present invention. Configuration 700 illustrates a surface of uniform continuous similar sized hemispheres. In an aspect, each hemisphere 702 has a diameter d, which has a range from 0.1 micrometers to 1 millimeter. Depending on the applications and the thickness of phosphor layers, diameter d of hemisphere 702 can be adjusted to minimize the TIR phenomenon. It should be noted that other configurations are possible as long as they do not have flat surfaces.

Figure 7B:
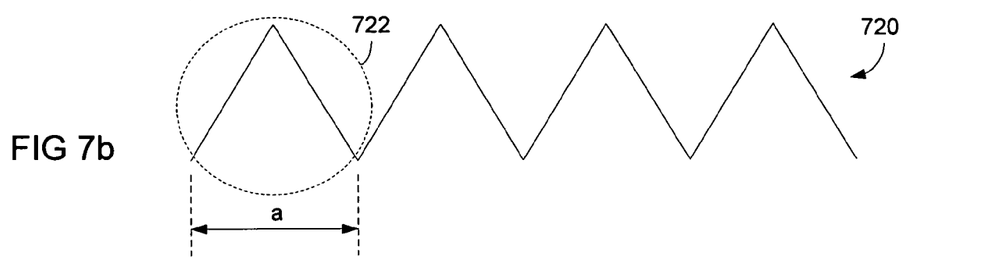

FIG. 7(b) illustrates an example of triangle configuration 720 for a phosphor layer in accordance with an aspect of the present invention. Configuration 720 illustrates a surface of uniform continuous similar sized triangles. In an aspect, each triangle 722 has three lines or segments, wherein each segment has a range from 0.1 micrometers to 1 millimeter. Depending on the applications and the thickness of phosphor layers, segment of triangle 722 can be adjusted to minimize the TIR phenomenon. It should be noted that other configurations are possible as long as they do not have flat surfaces.

Figure 7C:
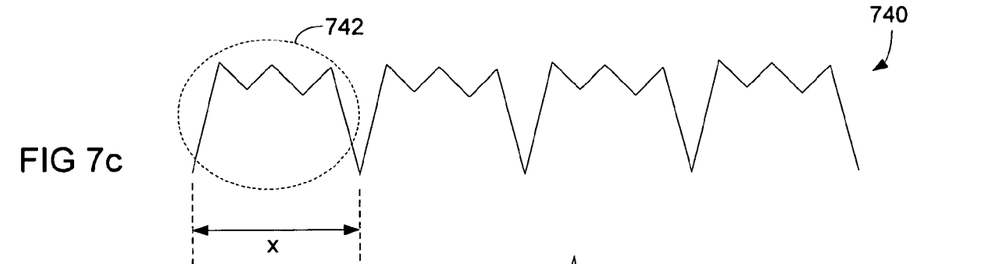

FIG. 7(c) illustrates another example of irregular triangle textured configuration 740 for a phosphor layer in accordance with an aspect of the present invention. Configuration 740 illustrates a surface of uniform continuous similar sized irregular triangles, wherein each large triangle 742 contains a set of smaller irregular triangles. In an aspect, the width x of large triangle 742 has a range from 0.1 micrometers to 1 millimeter. Depending on the applications and the thickness of phosphor layers, the width of triangle 742 can be adjusted to minimize the TIR phenomenon. It should be noted that other configurations are possible as long as they do not have flat surfaces.

Figure 7D:
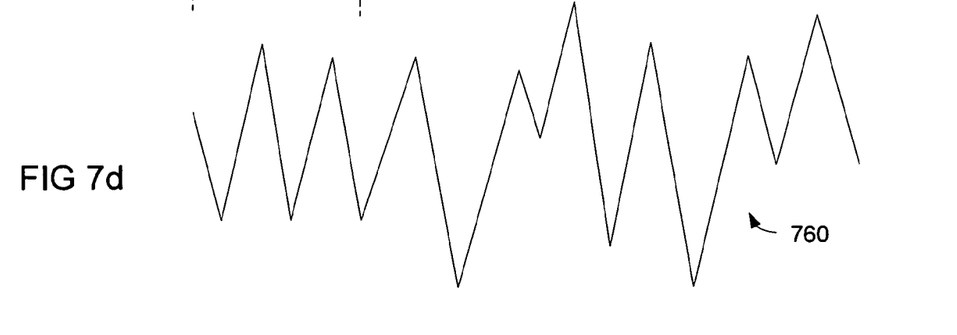

FIG. 7(d) illustrates another example of irregular triangle configuration 760 for a phosphor layer in accordance with an aspect of the present invention. Configuration 760 illustrates a surface of continuous irregular small sized triangles. In an aspect, the width of a cluster of triangles should have a range from 0.1 micrometers to 1 millimeter. Depending on the applications and the thickness of phosphor layers, the width of irregular triangles can be adjusted to minimize the TIR phenomenon. It should be noted that other configurations are possible as long as they do not have flat surfaces.

Figure 8:
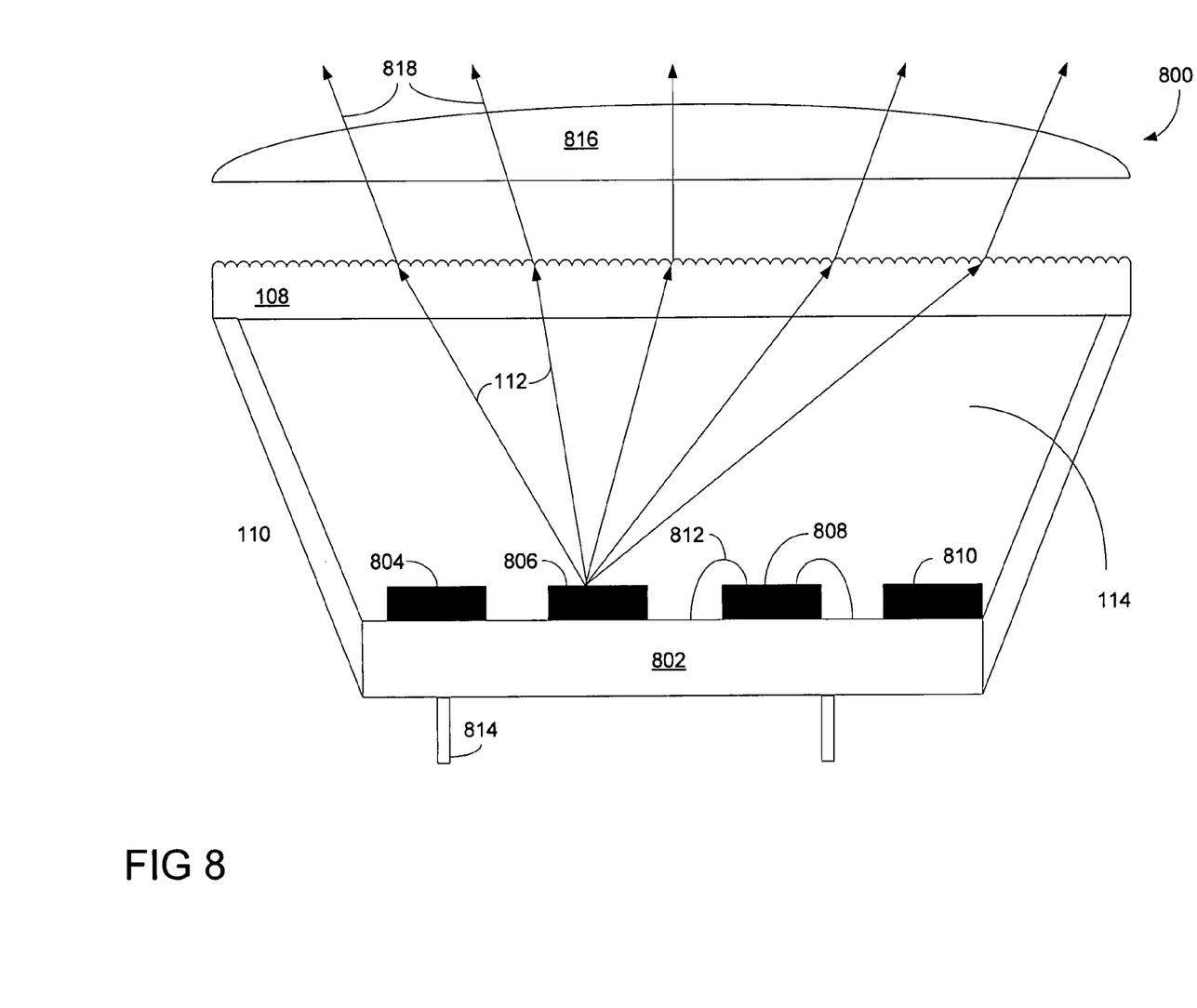
FIG. 8 illustrates an optical device having multiple solid state light emitters using a textured phosphor layer in accordance with an aspect of the present invention.

FIG. 8 illustrates an optical device 800 having multiple solid state light emitters using a textured phosphor layer in accordance with an aspect of the present invention. Device 800 includes a substrate 802, four LEDs 804-810, a phosphor layer 108, a lens 816, and walls 110. Walls 110 are used to separate optical device 800 from other components such as neighboring optical devices. Walls 110 can also be a part of housing or cup configuration. Substrate 802, for example, is further coupled to a circuit board, not shown in FIG. 8, via coupling elements 814. Device 800, in an aspect, etches a textured top surface over phosphor layer 108 to reduce the phenomenon of TIR. The total luminous lighting output for device 800 is enhanced when TIR is minimized. It should be noted that the underlying concept of the exemplary aspect(s) of the present invention would not change if one or more blocks (or layers) were added to or removed from device 800.

In an aspect, device 800 includes multiple LEDs 804-810 wherein LEDs can be placed on substrate 802 via various connecting mechanisms such as wire bonds 812, solder balls, or conductive adhesions, not shown in FIG. 8. Textured surface(s) on phosphor layer 108 reduces the TIR effect, which facilitates higher light output while keeps temperature within predefined range. An advantage of installing more than one LED in device 800 is to increase total luminous output. Lens 816 can be a glass, plastic, or silicon lens used for protecting phosphor islands 108 and device 800. In addition to providing device protection, lens 816 can provide a function of congregating light to form one or more light beams. It should be noted that additional layers or gas may be added between lens 816 and phosphor layer 108.

The exemplary aspect of the present invention includes various processing steps, which will be described below. The steps of the aspect may be embodied in machine or computer executable instructions. The instructions can be used to cause a general purpose or special purpose system, which is programmed with the instructions, to perform the steps of the exemplary aspect of the present invention. In another aspect, the steps of the exemplary aspect of the present invention may be performed by specific hardware components that contain hard-wired logic for performing the steps, or by any combination of programmed computer components and custom hardware components.

Figure 9:
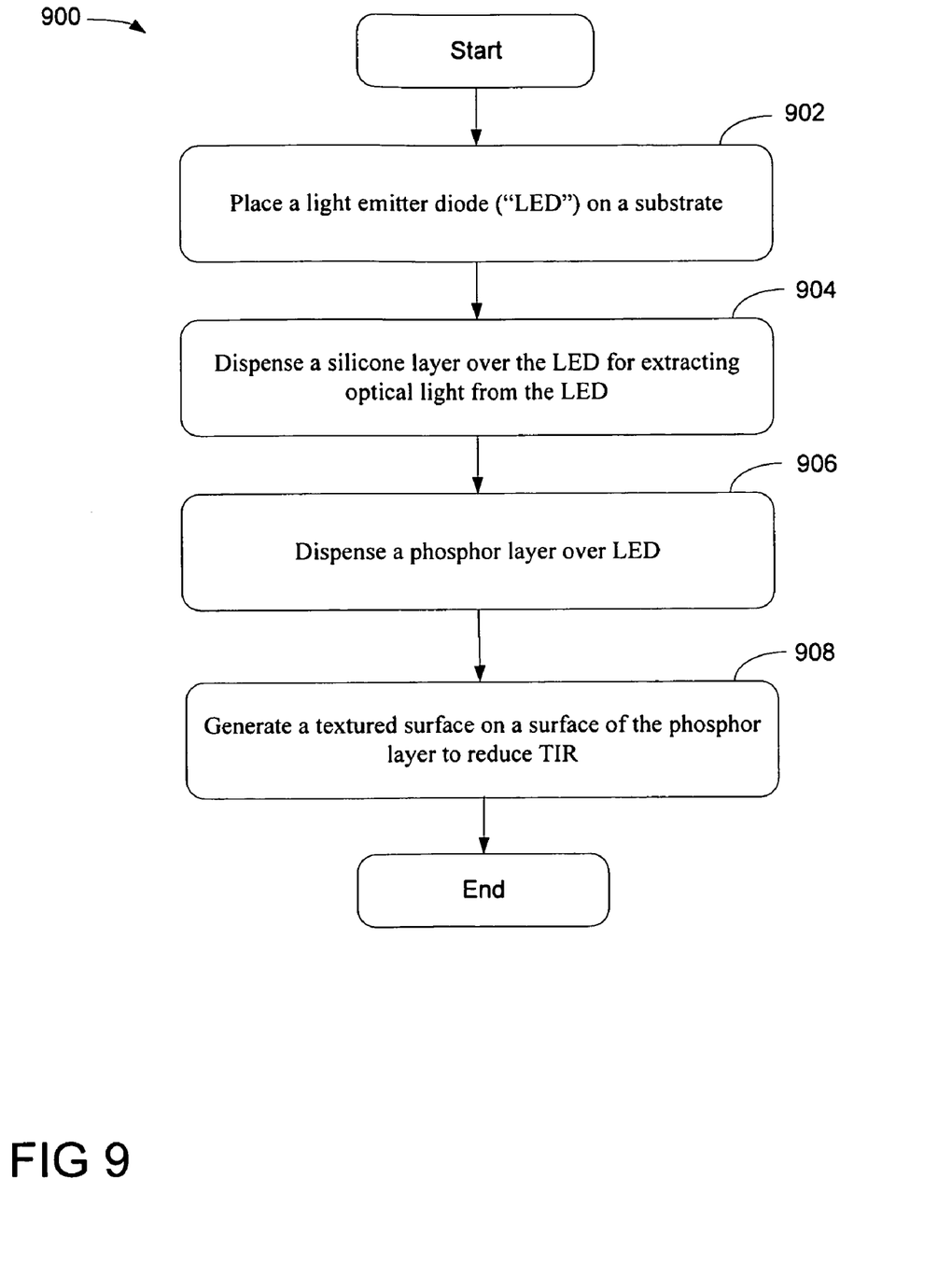
FIG. 9 is a flowchart illustrating a process of manufacturing a lighting device having a textured phosphor layer in accordance with an aspect of the present invention.

FIG. 9 is a flowchart 900 illustrating a process of manufacturing a lighting device having a textured phosphor layer in accordance with an aspect of the present invention. At block 902, a process places a light emitter diode ("LED") on a substrate. In an aspect, the process etches a solid state light device onto a multi-layered substrate, which can be further connected to a printed circuit board. The process is also capable of coupling more than one LED on the substrate.

At block 904, the process dispenses a silicone layer over the LED for extracting optical light from the LED. In an aspect, the process fills a layer of clear silicon between the LED and a phosphor layer, wherein the clear silicon perform a function of assisting light extracting from a solid state light source. Another function of the clear silicon is to anchoring LED to the substrate.

At block 906, the process dispenses a phosphor layer having an optical wavelengths range from 490 nanometer ("nm") to 590 nm for generating luminous cool light. For example, the process deposits a layer of yellow phosphor to generate luminous cool light. In another example, the process deposits a layer of green phosphor to generate luminous cool light.

At block 908, the process generates a textured top surface on the phosphor layer to reduce or minimize TIR between the phosphor layer and LED. In an aspect, the textured surface includes similarly shaped uniform configurations capable of reducing TIR. Upon creating a textured surface having continuously distributed hemispheres, the process is capable of setting a dimension of diameter for each hemisphere with a range between 0.1 micrometer and 1 millimeter. In another example, upon producing a textured surface with continuously distributed triangles, the process is capable of setting a size for the segment with a range between 0.1 micrometer and 1 millimeter. The process is further capable of texturing a bottom surface of the phosphor layer to minimize the TIR phenomenon. The process is also capable of depositing phosphor islands with textured surfaces for generating natural white or warm white light.

While particular aspects of the present invention have been shown and described, it will be obvious to those skilled in the art that, based upon the teachings herein, changes and modifications may be made without departing from this exemplary aspect(s) of the present invention and its broader aspects. Therefore, the appended claims are intended to encompass within their scope all such changes and modifications as are within the true spirit and scope of this exemplary aspect(s) of the present invention.

What is claimed is:

1. A light emitting device, comprising:
    a solid state light emitter capable of converting electrical energy to optical light;
    a phosphor layer, having a first surface and a second surface, disposed over the solid state light emitter for generating luminous light in response to the optical light, wherein the first surface of the phosphor layer is configured to include a texture having similarly shaped continuous configurations capable of reducing total internal reflection ("TIR") between the solid state light emitter and the phosphor layer; and
    a plurality of phosphor islands disposed over the phosphor layer for generating warmer light, wherein each of the plurality of phosphor islands includes a top surface and a bottom surface, wherein the top surface is configured to include a texture capable of reducing TIR between the phosphor layer and the plurality of phosphor islands.

2. The device of claim 1, further comprising a light extracting layer disposed between the phosphor layer and the solid state light emitter for extracting the optical light from the solid state light emitter.

3. The device of claim 2,
    wherein the light extracting layer is a clear silicone layer; and
    wherein the solid state light emitter is a light emitter diode ("LED").

4. The device of claim 3, wherein the light extracting layer is structured in a dome shape capable of extracting and scattering the optical light from the LED to the phosphor layer.

5. The device of claim 1, wherein the texture having similarly shaped continuous configurations is a surface with two-dimensional continuously uniformed distributed triangles.

6. The device of claim 1, wherein the texture having similarly shaped continuous configurations is a surface with two-dimensional continuously uniformed distributed hemispheres.

7. The device of claim 6, wherein each of the continuously distributed hemispheres has a diameter, which is in a range between 0.1 micrometer and 1 millimeter.

8. The device of claim 1, wherein the second surface, which faces a direction toward the solid state light emitter, includes a texture having similarly shaped uniform configurations capable of reducing TIR between the solid state light emitter and the phosphor layer.

9. The device of claim 1, wherein the first surface is configured to face a direction toward the solid state light emitter.

10. A method for manufacturing a lighting device, comprising:
    placing a light emitter diode ("LED") on a substrate;
    dispensing a silicone layer over the LED for extracting optical light from the LED;
    dispensing a phosphor layer over the silicone layer for generating luminous cool light;
    generating a textured surface on a first surface of the phosphor layer for reducing total internal reflections ("TIR") at the phosphor layer; and
    depositing a plurality of phosphor islands having a textured surface over the phosphor layer to generate warmer light and reduce TIR.

11. The method of claim 10, wherein generating a textured surface further includes etching a texture having similarly shaped uniform configurations capable of reducing TIR.

12. The method of claim 11, wherein etching a texture having a similarly shaped uniform configurations capable of reducing TIR includes providing a surface with continuously distributed hemispheres.

13. The method of claim 12, wherein providing a surface with continuously distributed hemispheres further includes setting a range of hemispherical diameter between 0.1 micrometer and 1 millimeter.

14. The method of claim 11, wherein creating a texture having a similarly shaped uniform configurations capable of reducing TIR includes providing a surface with continuously distributed triangles.

15. The method of claim 14, wherein providing a surface with continuously distributed triangles further includes setting a range of line segment between 0.1 micrometer and 1 millimeter.

16. The method of claim 10, further comprising generating a textured surface on a second surface of the phosphor layer for minimizing TIR at the phosphor layer.

17. An apparatus for manufacturing a lighting device, comprising:
   means for placing a light emitter diode ("LED") on a substrate;
   means for dispensing a silicone layer over the LED for extracting optical light from the LED;
   means for dispensing a phosphor layer over the silicone layer for generating luminous cool light;
   means for generating a textured surface on a first surface of the phosphor layer for reducing total internal reflections ("TIR") at the phosphor layer; and
   means for depositing a plurality of phosphor islands having a textured surface over the phosphor layer to generate warmer light and reduce TIR.

18. The apparatus of claim 17, wherein means for generating a textured surface further includes means for etching a texture having similarly shaped uniform configurations capable of reducing TIR.

19. The apparatus of claim 18, wherein means for etching a texture having a similarly shaped uniform configuration capable of reducing TIR includes means for providing a surface with continuously distributed hemispheres.

20. The apparatus of claim 19, wherein means for providing a surface with continuously distributed hemispheres further includes means for setting a range of hemispherical diameter between 0.1 micrometer and 1 millimeter.

* * * * *

UNITED STATES PATENT AND TRADEMARK OFFICE
CERTIFICATE OF CORRECTION

PATENT NO. : 7,825,427 B2
APPLICATION NO. : 12/209638
DATED : November 2, 2010
INVENTOR(S) : Tao Xu and Alex Shaikevitch It is certified that error appears in the above-identified patent and that said Letters Patent is hereby corrected as shown below:

On the title page item (57), in the ABSTRACT, line 1, replace "deploring" with "deploying".

Signed and Sealed this
Tenth Day of May, 2011

David J. Kappos
*Director of the United States Patent and Trademark Office*